(12) United States Patent
Eaves

(10) Patent No.: US 11,499,997 B2
(45) Date of Patent: Nov. 15, 2022

(54) METHOD FOR VALIDATING VOLTAGE MEASUREMENTS IN A DIGITAL-ELECTRICITY TRANSMISSION SYSTEM

(71) Applicant: VoltServer, Inc., East Greenwich, RI (US)

(72) Inventor: Stephen S. Eaves, Charlestown, MA (US)

(73) Assignee: VoltServer, Inc., East Greenwich, RI (US)

( * ) Notice: Subject to any disclaimer, the term of this patent is extended or adjusted under 35 U.S.C. 154(b) by 0 days.

(21) Appl. No.: 17/006,340

(22) Filed: Aug. 28, 2020

(65) Prior Publication Data

US 2021/0063447 A1     Mar. 4, 2021

Related U.S. Application Data

(60) Provisional application No. 62/893,281, filed on Aug. 29, 2019.

(51) Int. Cl.
  *G01R 19/165* (2006.01)
  *G01R 19/25* (2006.01)
  *H02H 7/26* (2006.01)

(52) U.S. Cl.
  CPC .... *G01R 19/16528* (2013.01); *G01R 19/2509* (2013.01); *G01R 19/2513* (2013.01); *H02H 7/263* (2013.01)

(58) Field of Classification Search
  CPC .......... G01R 19/16528; G01R 19/2513; G01R 19/2509; H02H 1/0061; H02H 3/05; H02H 1/0092; H02H 3/30; H02H 7/263
  See application file for complete search history.

(56) References Cited

U.S. PATENT DOCUMENTS 10,714,930 B1    7/2020 Weiss et al.
2007/0279039 A1* 12/2007 Seki ............... G01R 25/00
                                                     324/76.52

(Continued)

OTHER PUBLICATIONS

US Patent and Trademark Office, PCT International Search Report and Written Opinion for PCT/US2020/048579 (related PCT application) (dated Nov. 17, 2020).

*Primary Examiner* — Tarun Sinha
*Assistant Examiner* — Yossef Korang-Beheshti
(74) *Attorney, Agent, or Firm* — Modern Times Legal; Robert J. Sayre

(57) ABSTRACT

Transmission-line voltage measurements in a digital-electricity power system are validated by acquiring a series of transmission-line voltage measurements during a sample period when a transmitter-disconnect device is in a non-conducting state. A numerical analysis is performed to determine a point in time at which AC components in the transmission line have diminished and at which the primary change in the transmission-line voltage measurement values is due to DC decay. A receiver acquires a series of receiver-voltage measurements during the same sample period; and a numerical analysis is performed on the receiver-voltage measurements to determine the point in time at which the AC components have diminished and where the primary change in the transmission-line voltage measurement values is due to DC decay. The transmitter-disconnect device is then placed in a non-conducting state based on an evaluation of those measurements.

14 Claims, 2 Drawing Sheets

(56) References Cited

U.S. PATENT DOCUMENTS

| | | |
|---|---|---|
| 2009/0204268 A1 | 8/2009 | Eaves |
| 2012/0075759 A1 | 3/2012 | Eaves |
| 2013/0103220 A1 | 4/2013 | Eaves |
| 2015/0103954 A1* | 4/2015 | Funahashi ............... H04B 1/04 |
| | | 375/297 |
| 2015/0207318 A1 | 7/2015 | Lowe et al. |
| 2015/0215001 A1* | 7/2015 | Eaves ................... H04L 1/0033 |
| | | 375/224 |
| 2016/0134331 A1 | 5/2016 | Eaves |
| 2017/0214236 A1 | 7/2017 | Eaves |
| 2017/0229886 A1 | 8/2017 | Eaves |
| 2018/0313886 A1 | 11/2018 | Mlyniec et al. |

* cited by examiner

METHOD FOR VALIDATING VOLTAGE MEASUREMENTS IN A DIGITAL-ELECTRICITY TRANSMISSION SYSTEM

RELATED APPLICATION

This application claims the benefit of U.S. Provisional Application No. 62/893,281, filed 29 Aug. 2019, the entire content of which is incorporated herein by reference.

FIELD OF INVENTION

This invention relates to power-distribution-system safety-protection devices—for example, power-distribution systems with electronic monitoring to detect and disconnect power in the event of an electrical fault or safety hazard, particularly where the power transmission lines are dissipating an abnormally high amount of power loss—often called a "resistive fault" or "in-line fault". More specifically, this invention can be used in digital-electricity transmission systems. This invention is applicable to general power distribution and, in exemplifications, to, e.g., electric vehicle charging, telecommunications or alternative energy power systems.

BACKGROUND

Digital electric power, or digital electricity, can be characterized as any power format where electrical power is distributed in discrete, controllable units of energy. Packet energy transfer (PET) is a new type of digital electric power protocol disclosed in U.S. Pat. Nos. 8,068,937, 8,781,637 (Eaves 2012), and international patent application PCT/US2017/016870, filed 7 Feb. 2017.

The primary discerning factor in a digital-power transmission system compared to traditional analog power systems is that the electrical energy is separated into discrete units; and individual units of energy can be associated with analog and/or digital information that can be used for the purposes of optimizing safety, efficiency, resiliency, control, or routing. Since the energy in a PET system is transferred as discrete quantities, or quanta, it can be referred to as "digital power" or "digital electricity".

As described in Eaves 2012, a source controller and a load controller are connected by power-transmission lines. The source controller of Eaves 2012 periodically isolates (disconnects) the power transmission lines from the power source and analyzes, at a minimum, the voltage characteristics present at the source-controller terminals directly before and after the lines are isolated. The time period when the power lines are isolated was referred to by Eaves 2012 as the "sample period", and the time period when the source is connected is referred to as the "transfer period". The rate of rise and decay of the voltage on the lines before, during and after the sample period reveal if a fault condition is present on the power transmission lines. Measurable faults include, but are not limited to, short circuits, high line resistance, or the presence of an individual who has improperly come in contact with the transmission lines.

Eaves 2012 also describes digital information that may be sent between the source and load controllers over the power transmission lines to further enhance safety or provide general characteristics of the energy transfer, such as total energy or the voltage at the load controller terminals. One method for communications on the same digital-power transmission lines as used for power was further described and refined in U.S. Pat. No. 9,184,795 (Eaves Communication Patent).

U.S. Pub. Pat Application No. 2016/0134331 A1 (Eaves Power Elements) describes the packaging of the source-side components of Eaves 2012, in various configurations, into a device referred to as a digital-power transmitter.

U.S. Pat. No. 9,419,436 (Eaves Receiver Patent) describes the packaging of various configurations of the load-side components of Eaves 2012 into a device referred to as a digital-power receiver.

U.S. Pub. Pat Application No. 2018/0313886 A1 (Mlyniec Line Integrity) describes methods for verifying that voltage measurements on the transmitter side of the system meet minimum requirements for integrity in an environment containing electrical noise and where certain transmission-line properties are unknown.

The methods described in this specification build on the earlier work of Eaves 2012 and Mlyniec Line Integrity by focusing on a novel method to ensure the accurate detection of what was described in Eaves 2012 as an "in-line" fault. The electrical industry often uses the term, "resistive fault", interchangeably with "in-line" fault. In-line faults are defined as a fault where excessive power losses are experienced in the transmission lines between the source and load devices. For example, a loose termination can result in a high connection resistance. The high resistance can result in heating that can in-turn result in fire. In-line faults are one of the primary causes of electrical fires in the power distribution industry.

Eaves 2012, column 3, described a method for comparing the transmission line voltage on the transmitter side with the transmission line voltage as measured by the receiver in the receiver side of the transmission line. The difference in voltage combined with a known value of electrical current can be used to determine the in-line power loss value.

However, practical considerations for sensor accuracy, electrical noise and wiring errors make it advantageous to derive a method for validating the receiver-voltage measurements. This specification provides a method for the transmitter to obtain a valid measurement of the transmission-line voltage, as sampled by the receiver, and for validating the measurement without interrupting the normal transfer of electrical energy under packet-energy-transfer (PET) protocol.

SUMMARY

A method for obtaining a measurement of the transmission-line voltage from the receiver and for verifying the integrity of the measurement is described herein, where various embodiments of the methods and apparatus for performing the method may include some or all of the elements, features and steps described below.

In a digital-electricity power system comprising at least one transmitter, each transmitter monitors and controls voltage on a respective transmission line and interacts with one or more receivers connected to an opposite end of the respective transmission line, transmission-line voltage measurements are validated by acquiring a series of transmission-line voltage measurements during a sample period when a transmitter-disconnect device is in a non-conducting state. Numerical analysis is performed on the transmitter-voltage measurements to determine a point in time at which AC components in the transmission line have diminished and at which the primary change in the transmission-line voltage measurement values is due to DC decay and stores a first voltage measurement acquired at that point in time. The receiver is used to acquire a series of receiver-voltage measurements during the same sample period; and numerical analysis is performed on the receiver-voltage measurements to determine the point in time at which the AC components have diminished and at which the primary change in the transmission-line voltage measurement values is due to DC decay and storing a second voltage measurement acquired at that point in time. A difference calculation resulting from subtracting the first stored voltage measurement from the second stored voltage measurement is stored; and the transmitter-disconnect device is placed in a non-conducting state if the absolute value of the difference calculation is greater than a predetermined maximum value, wherein the transmission-line voltage measurements cannot be validated.

The detection of line faults involves periodic measurement of transmission line voltage. As will be described in detail, as line currents exceed 2-3 Amps on long transmission lines, detecting a fault representing excessive power loss on the transmission line becomes more difficult. This fault is referred to as an in-line fault. The difficulty can be alleviated by obtaining a signal representative of the voltage of the transmission line, measured on the receiver side of the transmission line. It is advantageous to have the ability to validate the measurement of the receiver-side voltage for accuracy without de-energizing the load. The disclosed method can be used to measure and ensure the integrity of the signal thus preventing false positive or false negative in-line fault determinations.

In executing PET protocol inherent to digital electricity, as described in Eaves 2012, a portion of the total energy packet period is allocated for the transfer of energy from the source to the load. This portion is referred to as the transfer period. The remaining time in the packet period is allocated for detecting faults and transferring data. This portion of the packet is referred to as the sample period.

In a first embodiment of in-line power loss determination described in Eaves 2012, Column 4, Lines 1-15, the transmitter samples the transmission line voltage obtained on the transmitter side of the transmission line during the transfer period when electrical current is allowed to flow in the line. A second measurement is taken by the transmitter during the sample period when no electrical current is flowing. The difference between the two voltage samples represents the voltage drop on the line between the transmitter and receiver. Multiplying the voltage drop by an electrical-current measurement performed by the transmitter produces a value representative of the in-line power loss on the transmission lines. If the loss exceeds a predetermined maximum, an in-line power fault is registered, and the transmitter de-energizes the line to avoid a fire or burn hazard.

In a second embodiment of in-line power-loss determination described in Eaves 2012, Column 3, Lines 50-65, the transmitter acquires a measurement of the transmission-line voltage at the transmitter terminals during the transfer period, and receives a second measurement, via an external communications link, of the transmission-line voltage, as acquired by the receiver during the transfer period, at the receiver terminals. The difference between the two samples represents the voltage drop on the line between the transmitter and receiver. Multiplying the voltage drop by an electrical-current measurement performed by the transmitter produces a value representative of the in-line power loss on the transmission lines.

In the first embodiment, described above, it becomes difficult to measure voltage accurately during the sample period because of line reflections and electrical noise from external electro-magnetic sources and adjacent digital-electricity transmission lines. The difficulty increases with higher currents and power levels. Line reflections are more pronounced in transmission lines with lengths exceeding two kilometers. In practice, in these long transmission lines, electrical currents above three or four amperes present significant challenges for accurate calculation of in-line power loss where an accuracy within +/−10 Watts is desirable. These problems and some solutions are presented in detail in U.S. Pub. Pat Application No. 2018/0313886 A1 (Mlyniec Line Integrity).

The second embodiment avoids much of the trouble of the first embodiment by using transmitter-side and receiver-side measurements that occur during the transfer period and before the transmission line current is interrupted in the sample period. The interruption of the transmission line current is a primary cause of line reflections. Additionally, measurements during the transfer period are inherently less susceptible to electrical-noise sources because the transmission-line impedance is much lower (because the line is not electrically isolated by the source- and load-disconnect devices), meaning that much more energy to is required to impose noise upon it.

However, a shortcoming of the second embodiment, not anticipated by Eaves 2012, can be improper validation of the receiver-side voltage measurement. For example, the receiver-side voltage-measurement circuitry can become uncalibrated, or a receiver with a different analog or digital gain factor can be inadvertently installed.

One less-desirable solution to this shortcoming can be to implement a self-test using a predetermined, calibrated, test voltage. Such a test, however, would need to be performed when the line is not transferring power, because any current in the transmission lines will cause a resistive voltage drop and, therefore, measurement error. Performing the test prior to initial power-up can also be impractical because the lines may afterwards operate for years without another opportunity to re-test and the test information may soon become "stale" and invalid. Periodically de-energizing the transmission lines to perform the test is impractical because the power provided is often critical to the operation of customer equipment.

A second less-desirable solution to the short-coming is to perform a test that compares the transmitter-side and receiver-side voltages during the transfer period, when current is flowing, and factor out the line-voltage drop due to current flow using software/firmware algorithmic methods. This approach, however, can also be impractical because the resistance and length of the transmission lines must be considered unknown to account for installation errors; and any operator input that might define it would be subject to human error.

The advantageous solution of this specification is to perform a calibration test during the sample period, rather than during the transfer period, and to then use the calibration to validate the transmission-line voltage measurements that are made during the transfer period. In other words, the second embodiment proposed by Eaves 2012 for measuring transmission-line voltages during the transfer period can be combined with a calibration or validation of the voltage-measurement capability during the sample period.

When performing the calibration test during the sample period, the transmitter has interrupted current to the transmission lines. During the test, both the receiver and transmitter measure the transmission-line voltage. The receiver communicates the voltage to the transmitter, using either the external communication link proposed in Eaves 2012 or the in-line communications method disclosed in U.S. Pat. No. 9,184,795 (Eaves Communication Patent). The transmitter verifies that the receiver voltage matches its own transmitter-side measurement.

Although the approach appears simple in theory, in practice it can be hindered by line reflections and electromagnetic interference. Line reflections emanate from the disruption in current when the transmitter-disconnect device interrupts current in transmission lines. The line reflections and interference can appear as voltage peaks that "bounce" between the transmitter and receiver.

The technique exploits a novel principle for a digital electricity system to validate the receiver-voltage measurement.

During the sample period, when all alternating-current (AC) components have diminished, as determined by the transmitter, despite the fact that the line voltage may still be decaying on a direct-current (DC) level from factors, such as cross-line resistance or even a cross-line fault, the voltage at the transmitter terminals and the voltage at the receiver terminals should be equal, even when separated by a long distance. Any non-equality is indicative of hardware failure or miscalibration.

As is described in Eaves 2012, both the transmitter and receiver components include disconnect devices that isolate the transmission lines from the energy source and the load during the sample period (the disconnect devices are referred to in Eaves 2012 as the source disconnect and load disconnect). Any AC component on the transmission lines during the sample period is then a combination of either line reflections or electrical noise being induced onto the lines. By first determining when the AC components have diminished to an insignificant level, and then separating them from subsequent voltage samples that represent only DC decay on the transmission lines, a valid voltage calibration point can be obtained. If the AC components do not diminish during the sample period, then the system is considered unstable; and the transmitter will initiate a fault shut-down by opening its disconnect device.

The safety functions of a digital electricity system involve a) transmission-line voltage measurements made sequentially that are compared differentially, or, in the case of in-line faults, b) a differential comparison of the transmitter terminal voltage measurements, as made by the transmitter to receiver terminal voltage measurements. By having the ability to validate voltage measurements made by the transmitter and receiver, a resilient method to ensure accurate in-line fault measurements is obtained.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Figure 1:
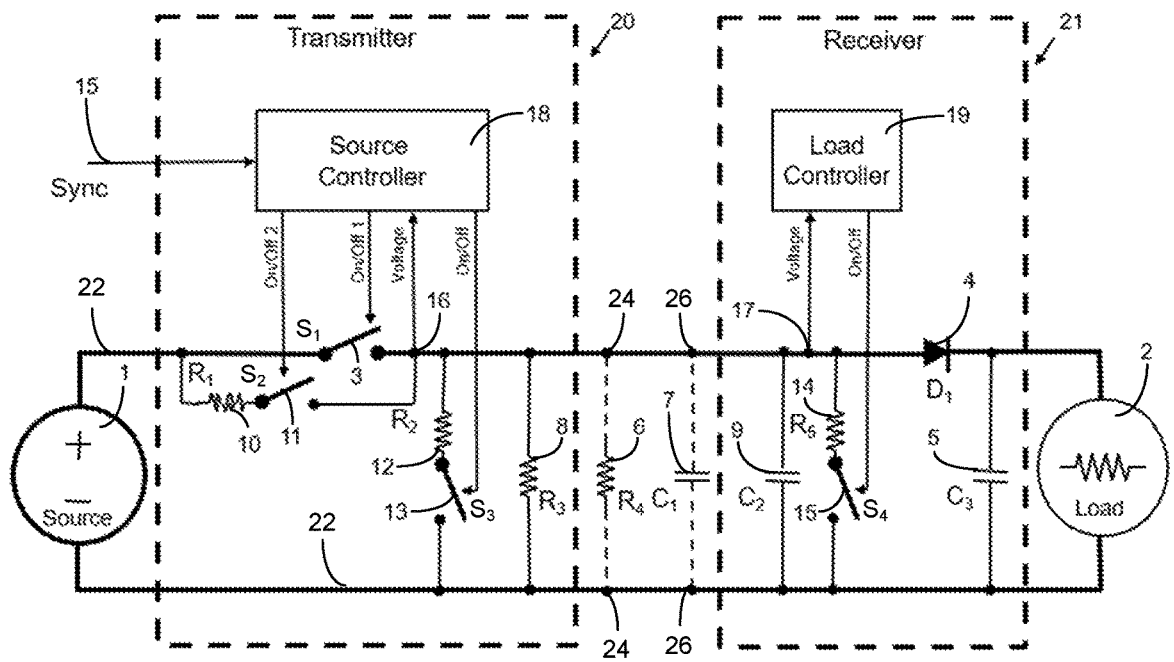
FIG. 1 is a block diagram of an exemplification of the safe power distribution system.

A representative digital-power system, as originally described in Eaves 2012, is shown in FIG. 1. The system includes a voltage source 1 and at least one load 2. The PET protocol is initiated by an operating switch 3 to periodically disconnect the source 1 from the power transmission lines 22 electrically joining the source 1 with the load 2. When the switch 3 is in an open (non-conducting) state, the lines are also isolated by isolation diode ($D_1$) 4 from any stored energy that may reside at the load 2.

Eaves 2012 offered several versions of alternative switches that can replace the isolation diode 4, and all versions can produce similar results when used in the presently described methods. Capacitor $C_3$ 5 is representative of an energy-storage element on the load side of the circuit.

The transmission lines 22 have inherent line-to-line resistance $R_4$ 6 and capacitance $C_1$ 7. The PET system architecture, as described by Eaves 2012, adds additional line-to-line resistance $R_3$ 8 and capacitance $C_2$ 9. At the instant switch 3 is opened, capacitances $C_1$ 7 and $C_2$ 9 have stored charge that decays at a rate that is inversely proportional to the additive values of resistances $R_4$ 6 and $R_3$ 8. Capacitor $C_3$ 5 does not discharge through resistances $R_3$ 8 and $R_4$ 6 due to the reverse blocking action of isolation diode $D_1$ 4. The amount of charge contained in capacitors $C_1$ 7 and $C_2$ 9 is proportional to the voltage across them and can be measured at points 16 and 17 by a source controller 18 or load controller 19.

Figure 2:
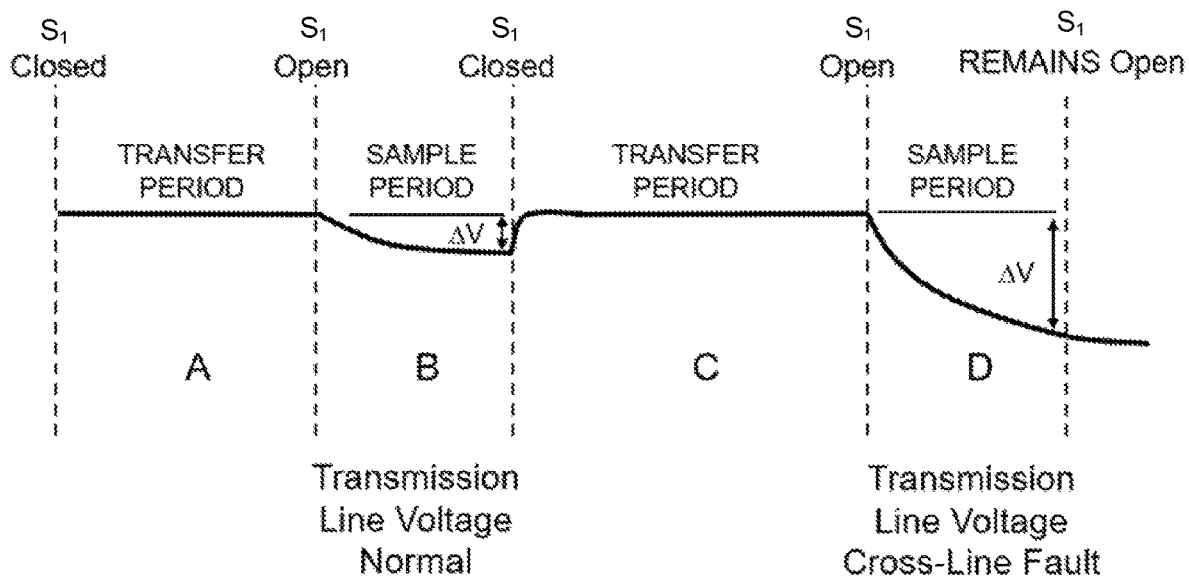
FIG. 2 is an illustration of a packet-energy-transfer voltage waveform.

As described in Eaves 2012, a change in the rate of decay of the energy stored in capacitances $C_1$ 7 and $C_2$ 9 can indicate that there is a cross-line fault on the transmission lines 22. The difference between normal operation and a fault, as presented by Eaves 2012, is illustrated in FIG. 2.

Referring again to FIG. 1, the combination of switch $S_1$ 3; source controller 18; resistor $R_1$ 10; switch $S_2$ 11; resistor $R_2$ 12; switch $S_3$ 13; and resistor $R_3$ 8 can be referred to as a transmitter 20. The combination of switch $S_4$ 15; resistor $R_5$ 14; load controller 19; diode $D_1$ 4; capacitor $C_2$ 9; and capacitor $C_3$ 5 can be referred to as a receiver 21.

Figure 3:
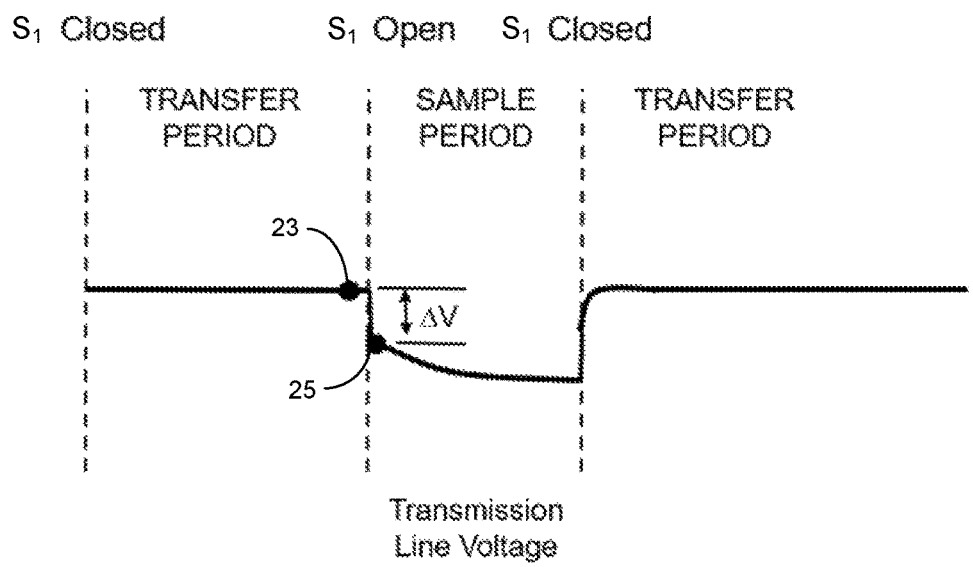
FIG. 3 illustrates in-line power loss determination for a transmission line in the absence of electrical noise or line reflections.

A method to measure in-line resistance without a communications link, as specified in Eaves 2012, is depicted in FIG. 3, which shows an ideal case where there are no line reflections or external electrical noise. The transmitter 20 measures its terminal voltage and electrical current nearly simultaneously in a first sample 23 during the same energy-transfer period just before opening the source disconnect $S_1$ 3. The transmitter 20 opens disconnect switch $S_1$ 3 and immediately takes another voltage sample 25. The difference between the first and second voltage samples 23 and 25 is proportional to the line resistance. The voltage difference between the first and second voltage samples 23 and 25 is independent of the normal, slower decay in voltage that occurs for the remainder of the sample period because the second voltage sample 25 is taken before the voltage on the transmission lines 22 has had time to decay significantly. By multiplying the difference in voltage by the current measurement, a value of in-line power loss is obtained.

Figure 4:
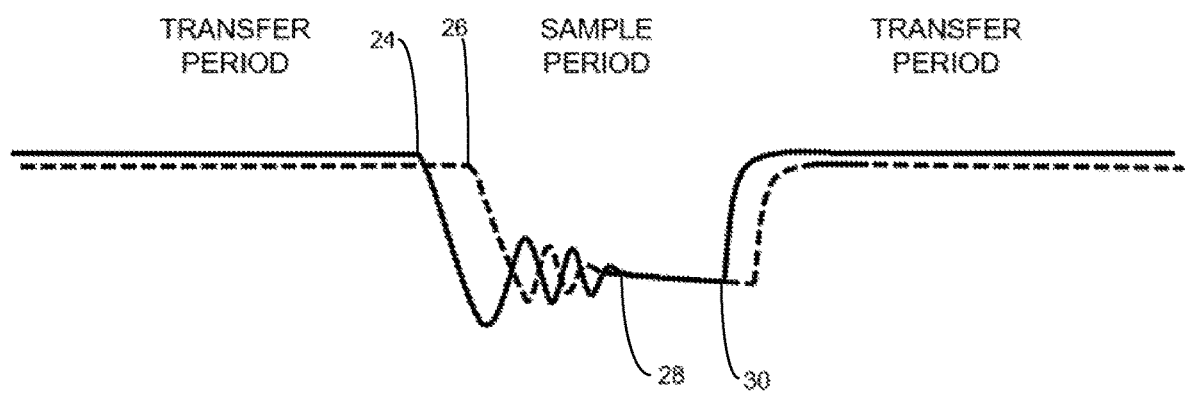
FIG. 4 illustrates an in-line power loss determination for a long transmission line with line reflections.

FIG. 4 depicts the transmission-line voltage as seen by the transmitter 20 (solid line) and as seen by the receiver 21 (dashed line) in a longer transmission line and/or at higher electrical currents. In this case, line reflections increase the complexity of making the simple in-line power-loss calculation described for FIG. 3. At the point where the transmitter-disconnect switch $S_1$ 3 is opened 24, the line voltage is higher at the transmitter terminals 24 than it is at the receiver terminals 26 due to the voltage drop when current is passed through the resistance of the transmission line 22. As can be seen by the difference in the horizontal axis positions of points 24 and 26 in FIG. 3 (representing the voltage at the transmitter and receiver terminals, respectively), there is also a time delay, due to the inductive and capacitive elements of the line 22, from when the transmitter disconnect first causes a drop in voltage as seen at the transmitter terminals 24, and when the drop is first seen at the receiver terminals 26. Using numerical-processing techniques well known in the signal-processing industry, the transmitter processor and receiver processor can make a determination of when the AC components of the transmission-line voltage have diminished to an insignificant value, at point 28, and where the remaining change in voltage is a DC decay due to the cross-line resistance of the transmission lines 22 or a cross-line fault, both of which are forms of DC decay. Further refinements on separating DC decay from AC components were described in the Mlyniec Line Integrity Patent, but Mlyniec did not disclose the ability to validate receiver-side measurements. At point 30, the transmitter closes the disconnect switch $S_1$ 3 again, and the voltage of the transmission line 22 rises.

It is in the area between points 28 and 30 that the voltage, as measured at the transmitter terminals 24, and the voltage, as measured by the receiver terminals 26, should match. Both the transmitter 20 and receiver 21 then calculate an average voltage value for the period between points 28 and 30. The receiver 21 transmits the average voltage value that it measured to the transmitter 20 using the communications link described in Eaves 2012 or using a communications data stream imposed on the transmission lines 22, as described in the Eaves Communication patent.

In some cases, it would be useful for the transmitter 21 to vary the value of its voltage source for the purposes of performing voltage measurements over a wider range and, therefore, testing whether the voltage measurements by the receiver 21 and voltage measurements by the transmitter 20 continue to match during the DC decay period. This technique can uncover problems related to gain error in the analog or digital calibration of the voltage sensing components. Alternatively, via the transmitter 20 changing its source voltage according to a predetermined pattern, the technique can be used to verify that the transmitter 20 is communicating with the correct receiver 21, particularly when an external communication link is used, as the communication connection could be inadvertently connected between the wrong transmitter 20/receiver 21 pair.

There are a number of numerical techniques well known to the signal-processing industry to extract the average voltage value between point 28 and point 30 of FIG. 3. These techniques can include simple averaging, digital filtering or interpolation methods, some of which are described in the Mlyniec Line Integrity Patent. Signal-processing tasks otherwise performed by the receiver 21 can be off-loaded to the transmitter 20 by transmitting "raw" voltage measurements from the receiver 21 to the transmitter 20.

The systems and methods of this disclosure can be implemented in a computing-system environment. Examples of well-known computing system environments and components thereof that may be suitable for use with the systems and methods include, but are not limited to, personal computers, server computers, hand-held or laptop devices, tablet devices, smart phones, multiprocessor systems, microprocessor-based systems, set-top boxes, programmable consumer electronics, network personal computers (PCs), minicomputers, mainframe computers, distributed computing environments that include any of the above systems or devices, and the like. Typical computing system environments and their operations and components are described in many existing patents (e.g., U.S. Pat. No. 7,191,467, owned by Microsoft Corp.).

The methods may be carried out via non-transitory computer-executable instructions, such as program modules. Generally, program modules include routines, programs, objects, components, data structures, and so forth, that perform particular tasks or implement particular types of data. The methods may also be practiced in distributed computing environments where tasks are performed by remote processing devices that are linked through a communications network. In a distributed computing environment, program modules may be located in both local and remote computer storage media including memory storage devices.

The processes and functions described herein can be non-transitorily stored in the form of software instructions in the computer. Components of the computer may include, but are not limited to, a computer processor, a computer storage medium serving as memory, and a system bus that couples various system components including the memory to the computer processor. The system bus can be of any of several types of bus structures including a memory bus or memory controller, a peripheral bus, and a local bus using any of a variety of bus architectures.

The computer typically includes one or more a variety of computer-readable media accessible by the processor and including both volatile and nonvolatile media and removable and non-removable media. By way of example, computer-readable media can comprise computer-storage media and communication media.

The computer storage media can store the software and data in a non-transitory state and includes both volatile and nonvolatile, removable and non-removable media implemented in any method or technology for storage of software and data, such as computer-readable instructions, data structures, program modules or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed and executed by the processor.

The memory includes computer-storage media in the form of volatile and/or nonvolatile memory such as read only memory (ROM) and random access memory (RAM). A basic input/output system (BIOS), containing the basic routines that help to transfer information between elements within the computer, such as during start-up, is typically stored in the ROM. The RAM typically contains data and/or program modules that are immediately accessible to and/or presently being operated on by the processor.

The computer may also include other removable/non-removable, volatile/nonvolatile computer-storage media, such as (a) a hard disk drive that reads from or writes to non-removable, nonvolatile magnetic media; (b) a magnetic disk drive that reads from or writes to a removable, nonvolatile magnetic disk; and (c) an optical disk drive that reads from or writes to a removable, nonvolatile optical disk such as a CD ROM or other optical medium. The computer-storage medium can be coupled with the system bus by a communication interface, wherein the interface can include, e.g., electrically conductive wires and/or fiber-optic pathways for transmitting digital or optical signals between components. Other removable/non-removable, volatile/nonvolatile computer storage media that can be used in the exemplary operating environment include magnetic tape cassettes, flash memory cards, digital versatile disks, digital video tape, solid state RAM, solid state ROM, and the like.

The drives and their associated computer-storage media provide storage of computer-readable instructions, data structures, program modules and other data for the computer. For example, a hard disk drive inside or external to the computer can store an operating system, application programs, and program data.

Thus, the scope of the disclosed invention should be determined by the appended claims and their legal equivalents, rather than the examples given. In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. Still further, the components, steps and features identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

I claim:

1. In a digital-electricity power system comprising at least one transmitter, each transmitter monitoring and controlling voltage on respective transmission lines and interacting with one or more receivers connected to an opposite end of the respective transmission lines, a method for validating transmission-line voltage measurements, comprising:
   a) acquiring a series of transmission-line voltage measurements, measuring voltage in at least one of the transmission lines during a sample period when a transmitter-disconnect device is in a non-conducting state;
   b) performing numerical analysis on the transmission-line voltage measurements to determine a point in time at which AC components in the transmission line have diminished and at which the primary change in the transmission-line voltage measurement values is due to DC decay, and storing a first voltage measurement acquired at that point in time;
   c) using the receiver to acquire a series of receiver voltage measurements measuring voltage in the receiver, during the same sample period;
   d) performing numerical analysis on the receiver voltage measurements to determine the point in time at which the AC components have diminished and at which the primary change in the transmission-line voltage measurement values is due to DC decay and storing a second voltage measurement acquired at that point in time;
   e) performing a difference calculation, wherein the difference calculation determines a difference between the first stored voltage measurement and the second stored voltage measurement, and storing the difference; and
   f) placing the transmitter-disconnect device in a non-conducting state if the difference is greater than a predetermined maximum value, wherein the transmission-line voltage measurements cannot be validated.

2. The method of claim 1, wherein the transmitter acquires the series of transmission-line voltage measurements, performs the difference calculation, and takes action to place the transmitter-disconnect device in the non-conducting state, and wherein the transmitter or the receiver is used to perform the numerical analysis on the transmission-line voltage.

3. The method of claim 1, wherein the receiver performs the numerical analysis on the receiver voltage measurements, produces the transmission-line voltage measurement values, and communicates the transmission-line voltage measurement values to the transmitter.

4. The method of claim 1, wherein the receiver voltage measurements acquired by the receiver are communicated to the transmitter without performing the numerical analysis that determines when the AC components have diminished, and where the numerical analysis of the receiver voltage measurements is performed by the transmitter.

5. The method of claim 1, wherein, when the transmitter determines that the AC components of the transmission-line voltage measurements do not diminish within a predetermined time period, then the transmitter takes action to place the transmitter-disconnect device in a non-conducting state and registers a fault because the transmission-line voltage is considered unstable.

6. The method of claim 1, wherein the transmitter and receiver first determine a point in time when the AC components of their respective voltage measurements have diminished and then average a plurality of transmission-line voltage measurements after that point to produce one average voltage value for the transmitter and one average voltage value for the receiver, and wherein the transmitter uses the difference in the average values to determine if the transmission-line voltage measurements are valid.

7. The method of claim 1, wherein the transmitter is in electrical communication with a voltage source, the method further comprising the transmitter varying the voltage of the voltage source to perform voltage measurements over a wider range and testing whether voltage measurements by the receiver and voltage measurements by the transmitter continue to match when the primary change in the transmission-line voltage measurements is due to DC decay at different voltages.

8. The method of claim 1, wherein the receiver is supplied with the transmission-line voltage measurements, performs the difference calculations and communicates back to the transmitter if the transmission-line voltage measurements are invalid, and wherein the transmitter takes action to place the transmitter-disconnect device in a non-conducting state.

9. A digital-electricity power system, comprising:
at least a pair of transmission lines;
at least one transmitter in electrical communication with a transmission end of the transmission lines, wherein the transmitter is configured to transmit digital-electricity power over the transmission lines and is further configured to measure and control voltage on respective transmission lines; and
at least one receiver in electrical communication with a receiving end of the transmission lines, wherein the transmitter is configured to interact with the receiver;
a controller in the transmitter or in the receiver, wherein the controller includes a processor and a computer-readable medium in communication with the process and non-transitorily storing software code including instructions for:
a) using the at least one transmitter to acquire a series of transmission-line voltage measurements, measuring voltage in at least one of the transmission lines, during a sample period when a transmitter-disconnect device is in a non-conducting state;
b) using the receiver to acquire a series of receiver voltage measurements, measuring voltage in the receiver, during the same sample period;
c) transferring the receiver voltage measurements to the transmitter;
d) calculating when AC components of the transmission-line voltage measurements and AC components of the receiver voltage measurements have diminished to a point at which the primary change in the transmission-line voltage measurements is due to DC decay and storing a first voltage measurement acquired at that point;
e) determining the voltage values at the transmitter and receiver at a point after the AC components have diminished to the point at which the primary change in the voltage measurements is due to DC decay in both the transmission-line and receiver voltage measurements; and
f) placing the transmitter-disconnect device in a non-conducting state if the difference between the voltage value in the transmission lines and the voltage value in the receiver is greater than a predetermined maximum value, wherein the transmission-line voltage measurements cannot be validated.

10. The digital-electricity power system of claim 9, wherein the receiver is configured to be supplied with the transmitter voltage measurements, to perform the difference calculations, and to communicate back to the transmitter if the transmission-line voltage measurements are invalid, wherein the transmitter is configured to take action to place the transmitter-disconnect device in a non-conducting state.

11. The digital-electricity power system of claim 9, wherein the receiver is configured to first process voltage measurements acquired by the receiver to determine the point where the AC components have substantially diminished and to communicate back to the transmitter a value representative of the voltage at the receiver end of the transmission lines after the AC components have diminished.

12. The digital-electricity power system of claim 9, wherein the software code further includes instructions for the transmitter to take action to place the transmitter-disconnect device in a non-conducting state and to register a fault when the transmitter determines that the AC components of the transmission-line voltage measurements do not diminish within a predetermined time period because the transmission-line voltage is considered unstable.

13. The digital-electricity power system of claim 9, wherein the software code further includes instructions for the transmitter and receiver to first determine a point in time when the AC components of their respective voltage measurements have diminished, to then average a plurality of transmission-line voltage measurements after that point to produce one average voltage value for the transmitter and one average voltage value for the receiver, and to use the difference in the average values to determine if the transmission-line voltage measurements are valid.

14. The digital-electricity power system of claim 9, wherein the transmitter is in electrical communication with a voltage source, the software code further comprising instructions for the transmitter to vary the voltage of the voltage source to perform voltage measurements over a wider range and to test whether voltage measurements by the receiver and voltage measurements by the transmitter continue to match during the DC decay period at different voltages.

* * * * *